United States Patent [19]

Engelke

[11] Patent Number: 5,166,888
[45] Date of Patent: Nov. 24, 1992

[54] FABRICATION OF PARTICLE BEAM MASKS

[75] Inventor: Helmut Engelke, Altdorf, Fed. Rep. of Germany

[73] Assignee: International Business Machines Corporation, Armonk, N.Y.

[21] Appl. No.: 626,087

[22] Filed: Dec. 11, 1990

[30] Foreign Application Priority Data

Dec. 18, 1989 [EP] European Pat. Off. ........... 89123346

[51] Int. Cl.$^5$ .................. G06F 15/20; H01J 27/00
[52] U.S. Cl. ................................ 364/491; 364/490; 364/489; 364/488; 250/492.3
[58] Field of Search ............ 364/488, 489, 490, 491; 250/398, 492.2, 492.21, 492.22, 492.3

[56] References Cited

U.S. PATENT DOCUMENTS

| | | | |
|---|---|---|---|
| 4,109,029 | 8/1978 | Ozdemir et al. | 250/492.2 |
| 4,132,898 | 1/1979 | Buelow et al. | 250/492.2 |
| 4,520,269 | 5/1985 | Jones et al. | 250/492.2 |
| 4,717,644 | 1/1988 | Jones et al. | 250/492.3 |

OTHER PUBLICATIONS

"Electron-Beam Proximity Printing-A New High-Speed Lithography Method for Submicron Structures" by H. Bohlen, IBM J. Res. Develop., vol. 26, No. 5, Sep. 1982, pp. 568-579.

Primary Examiner—Vincent N. Trans
Attorney, Agent, or Firm—Francis J. Thornton

[57] ABSTRACT

A method for automatically splitting a layout of a hole pattern into two complementary arrangements for x-ray, electron beam, ion beams, i.e., particle beam masks. The method determines all inside and outside corners of said pattern and determining a stability value for the pattern so the pattern can be divided into stable sections and alternately distributed over two complementary masks.

6 Claims, 6 Drawing Sheets

FABRICATION OF PARTICLE BEAM MASKS

DESCRIPTION

This invention relates to a method for forming complementary self-supporting masks for exposing semiconductor chips with particle beams such as ions, x-rays or electrons.

Such self-supporting masks use physical holes as transparent areas, with the consequence that it is not possible to fabricate, for example, a ring-shaped structure with only one mask as this structure cannot support its center. This so-called mask stencil problem is solved by exposing the chip with two complementary masks as described for example in the IBM Journal of Research and Development, Volume 26, Number 5, and in the IBM Technical Report, TR 28.120 February 1981.

The method, described in these references, is complex, time consuming and often results in complementary masks which have mechanical instabilities therein.

For that reason, it is an object of the invention to create a new method for splitting a layout of a pattern which can be carried out automatically and results in more mechanically stable masks.

The method, of the present invention, determines all corners of the pattern to be created, then a stability criterion is carried out for these corners, to provide a plurality of sections which, when formed in complementary masks, minimize any unstability in the masks so formed.

The method, of the present invention, can be carried out automatically, for example by a computer, by executing one step after the other. Furthermore, this method considers the requirement that the complementary masks have to be as mechanically stable as possible. This is a very important requirement for the practical use of these masks. Furthermore, the method does not use all corners for cutting the hole representing area into sections but only those corners which are instable. This has the effect of reducing computing time as well as the required computer storage capacity.

The foregoing aspects and other features of the invention are explained in the following description taken in connection with the accompanying drawings wherein.

Figure 1:
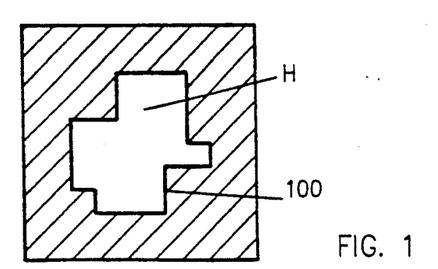
FIG. 1 is a top view of a polygonal hole pattern.
Figure 3A:
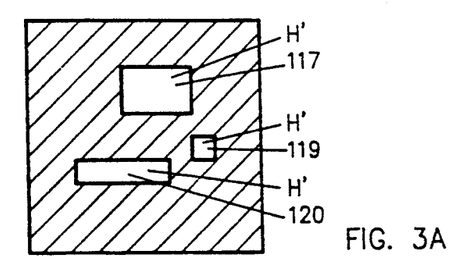
FIGS. 3a and 3b are top views of two complementary masks using the sections of FIG. 2c and which together correspond to the pattern of FIG. 1.
Figure 3B:
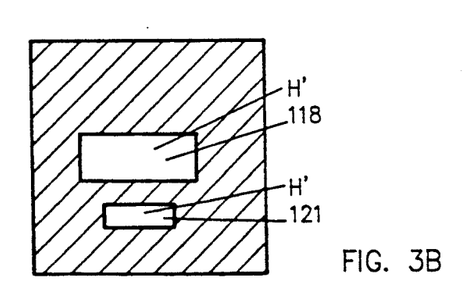

FIG. 1 shows a polygonal hole pattern H such as might be used for exposing semiconductor chips to particle beams. In contrast to that, FIGS. 3a and 3b show two masks which were fabricated with the help of the splitting method of the present invention. Both masks of FIGS. 3a and 3b taken together "correspond" to the pattern H of FIG. 1, that means, that the exposure of a chip with the masks of FIGS. 3a and 3b in succession would have the same result as the exposure of a chip with a mask having the pattern H of FIG. 1.

The masks shown in FIGS. 3a and 3b are made of silicon, for example with a thickness of about 3 micrometer. The pattern H shown in FIG. 1 has a perimeter 100 in the form of a polygon. Pattern H can be also defined by several sections as shown by the masks of FIGS. 3a and 3b. The splitting method will be described with the help of FIGS. 2a to 2c.

Figure 2A:
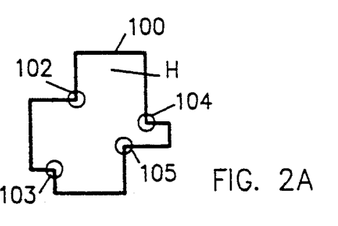
FIGS. 2a to 2c show the steps in which the pattern of FIG. 1 is divided into sections.

FIG. 2a shows polygon 100 as consisting of a number of corners and edges. Some of said corners extend into the pattern and are called inside corners and have the numerals 102, 103, 104 and 105 in FIG. 2a. All other corners of the polygon 100 are called outside corners.

The first step of the present invention requires that all inside corners 102, 103, 104 and 105 of said polygon 100 of FIG. 2a be determined.

Figure 2B:
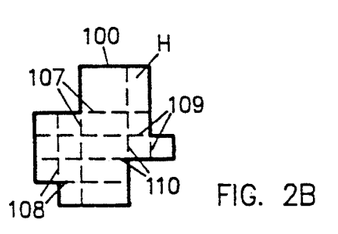

In the next step, which is shown in FIG. 2b, cutting lines 107, 108, 109, 110, 112, 113, 114 and 115 are laid down and run from the inside corners 102, 103, 104 and 105, to an opposing edge. Each corner 102, 103, 104 and 105 is provided with two cutting lines which are rectangular. All these cutting lines have points of intersection with the perimeter 100.

Figure 2C:
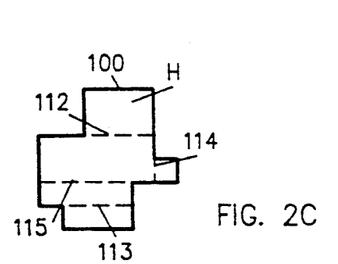

Out of these cutting lines the non-intersecting ones with the shortest length are selected. In FIG. 2c the lines so selected are 112, 113, 114 and 115.

With the help of the cutting lines 112, 113, 114 and 115 the polygon is now partitioned into several sections and distributed to the two masks as shown in FIGS. 3a and 3b as sections 117, 118, 119, 120 and 121. Section 117 is bounded by a part of the perimeter 100 of polygon and the cutting line 112, section 118 by a part of the perimeter 100, by the cutting lines 112, 114 and 115. The other sections 119, 120, 121 are similarly formed. The sections 117, 118, 119, 120 and 121 are distributed alternatively to said two masks of FIGS. 3a and 3b, that means that adjacent sections are distributed to different masks, e.g. section 117 to the mask shown in FIG. 3a and section 118 to the mask shown in FIG. 3b.

All sections 117, 118, 119, 120 and 121 of the masks shown in FIGS. 3a and 3b are marked by an H'. This emphasizes that all these sections are formed as physical holes in the two masks. Adding up the representing areas H' in FIGS. 3a and 3b results in an area equal to the area of pattern H of FIG. 1. For that reason, the two masks shown in FIGS. 3a and 3b together correspond to the pattern H shown in FIG. 1.

For a better understanding, the mechanical stability of the masks was not considered in connection with the foregoing example. This will be done now with respect to FIGS. 4 to 7.

Figure 4:
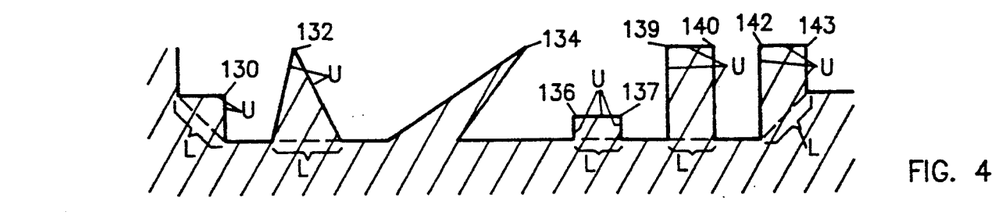
FIG. 4 is a top view of six different corners that may appear in a mask pattern.

FIG. 4 shows several examples of possible inside corners 130, 132, 134, 136, 137, 139, 140, 142 and 143 that can be required in a mask. As all these inside corners extend into the region of a physical hole, each of them has a mechanical stability which defines the amount the inside corner departs from the plane of the rest of the mask. Generally, the more an inside corner of a mask extends into a hole, the more likely it will deflect and be non-planar with the rest of the mask.

According to the invention, a stability value S is assigned to any of said inside corners. This stability value S is the quotient of a short cut length L and a portion U of the entire perimeter:

$$S = L/U.$$

The short cut length L is defined as the shortest distance between adjacent outside corners and is shown in FIG. 4 in connection with the inside corners 130, 132, 136, 137, 139, 140 and 142, 143 in broken lines.

The perimeter U is defined as the sum of the lengths from a first outside corner to a first inside corner and a back to the next adjacent outside corner on the other side of said first inside corner. The difference between the short cut length L and the perimeter U is that the short cut length L is the shortest distance between said two next adjacent outside corners and is independent of any edges, whereas the perimeter U is the longest distance along edges between said two outside corners.

In connection with the inside corners 130, 132 and 134 the perimeter U consists of the length of two edges as shown in FIG. 4. In connection with the inside corners 136, 137, 139, 140 and 142, 143, where always two inside corners are arranged in a row, the perimeter U consists of the length of three edges, respectively, as shown in FIG. 4.

In cases where the inside corner is formed of diagonals such that the inside corner is not located above the short cut length, i.e. inside corner 134, the inside corner has no mechanical stability as defined herein and thus neither L or U need be measured.

Figure 5:
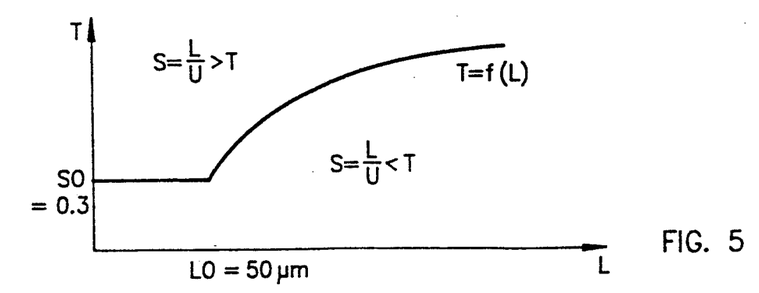
FIG. 5 is a diagram showing the dependency of the stability limit value T and the short cut length L used in the present invention.

In FIG. 5 a graph of a stability limit function T is shown. This stability limit function T depends on the short cut length L: $T = f(L)$. According to the graph, the stability limit function T is constant and has the value $SO = 0.3$ for short cut lengths up to $LO = 50$ micrometer. The values $SO = 0.3$ and $LO = 50$ micrometer are empirical values which have proved advantageous. For short cut lengths greater than 50 micrometers the stability limit function T follows the increasing curve as shown.

All inside corners with a stability value S which is less than the stability limit function T have no mechanical stability, whereas all inside corners with a stability value S which is greater than said stability limit function T are mechanically stable. This means that all stability values S which are below the curve belong to unstable inside corners and all stability values S which are above belong to stable inside corners.

According to the invention, not all inside corners are taken for planning and creating cutting lines, but only those inside corners which are unstable. All inside corners which have a mechanical stability are not taken into consideration. This is determined by comparing the stability value S of said inside corner with the stability limit function T.

If for example the inside corners 103 and 104 of the mask shown in FIGS. 1 and 2a are stable, only the unstable inside corners 102 and 105 would be considered for creating cutting lines.

Figure 6A:
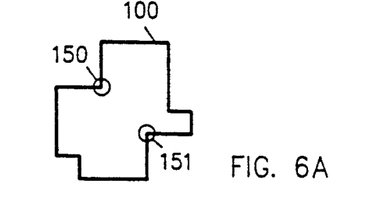
FIGS. 6a and 6b show the steps in which the pattern of FIG. 1 is divided into sections different from those of FIG. 2c.
Figure 6B:
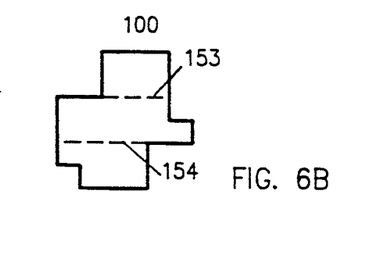

This is shown in FIG. 6a where the unstable inside corners have the numerals 150 and 151. With these inside corners 150 and 151 the same steps are carried out as already described in connection with FIGS. 2a, 2b and 2c. First, each of said inside corners 150 and 151 is provided with a pair of cutting lines, then sets of cutting lines are planned which do not intersect and finally that set of cutting lines is selected which has the shortest length of all cutting lines summed up. This result of said selected set of cutting lines is shown in FIG. 6b where said cutting lines have the numerals 153 and 154.

Figure 7A:
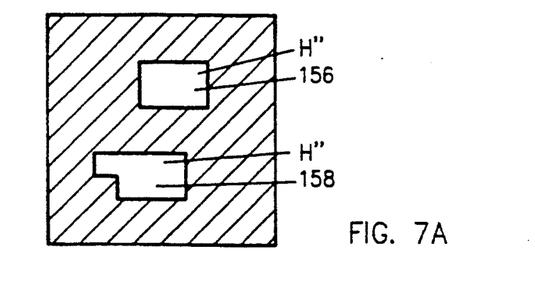
FIGS. 7a and 7b are top views of two complementary masks using the sections of FIG. 6b and which together correspond to the pattern of FIG. 1.
Figure 7B:
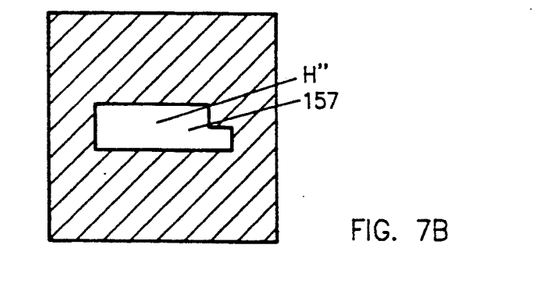

After that, the sections which are created by said cutting lines 153 and 154 are distributed alternatively onto two masks. These two masks are shown in FIG. 7a and 7b where said sections have the numerals 156, 157 and 158. Again, these sections 156, 157 and 158 are physical holes in said masks and are marked with an H'' shown in FIG. 7a and 7b equate the area of the pattern H as shown in FIG. 1. For that reason, the two masks shown in FIG. 7a and 7b correspond to the pattern H shown in FIG. 1.

With respect to FIGS. 8 to 13 another additional step in connection with the examination of the mechanical stability of the inside corners of a mask will now be described.

Figure 8:
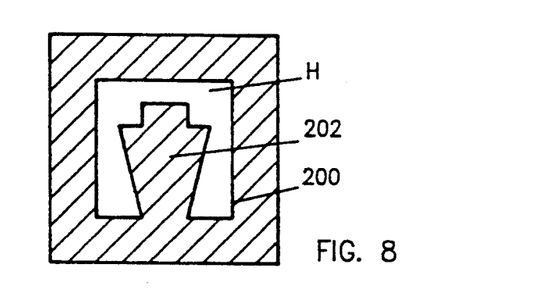
FIG. 8 is a top view of a polygonal pattern including a kind of tongue.

FIG. 8 shows a polygon 200 which includes a tongue region 202 which defines an area H. This tongue 202 has low mechanical stability when created in a mask.

As already described, the first step for splitting said pattern to form two corresponding masks is determining the stability of all inside corners. These inside corners have the numerals 204, 205, 206 and 207 in FIG. 9a. The stability value S of all said inside corners 204, 205, 206 and 207 when established as discussed above, i.e. measuring the perimeter U between adjacent outside corners and compared with the stability limit function T, each inside corner would be mechanically stable.

Figure 9A:
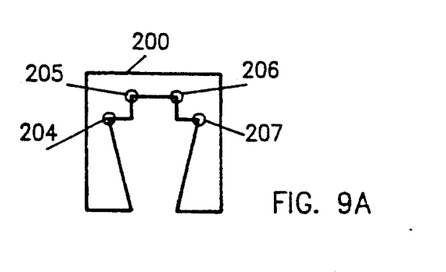
FIGS. 9a to 9c show the steps in which the pattern of FIG. 8 is divided into sections.

However, the tongue region 202 taken as a whole is unstable.

According to the method described in connection especially with FIGS. 6a and 6b, only unstable inside corners are provided with cutting lines. This would have the consequence, that in the assumed case of FIG. 9a where all inside corners are stable no cutting lines would be created. As a result, the unstable tongue 202 would not be eliminated.

According to the invention, this is overcome as follows with the help of hull polygons.

Figure 9B:
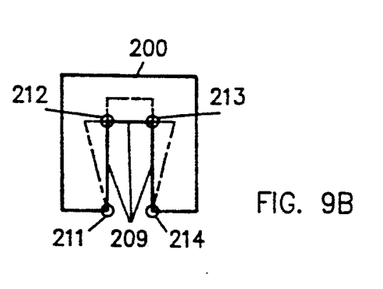

First, all outside corners are determined which are adjacent to the inside corners. In FIG. 9b these outside corners have the numerals 211, 212, 213 and 214. These outside corners are then interconnected with lines 209 which as a whole constitute the hull polygon as shown in FIG. 9b overlying the tongue 202 which in this figure is indicated by broken lines.

The newly defined hull polygon 209 is examined according to the method as already described. During this examination, the former outside corners 212 and 213 are now considered as if they were inside corners for the hull polygon 209 and when so considered the polygon 209 is found to be unstable when compared with the stability limit function T.

Now, the stability of the adjacent inside corners 204, 205, 206 and 207 of the corners 212 and 213 are considered. In the present case the inside corners 205 and 206 are found to have a lower stability value S than the inside corners 204 and 207. After that, cutting lines are planned and created in connection with said selected inside corners 205 and 206 according to the method already described. These cutting lines have the numerals 216 and 217 in FIG. 9c. At the end, as already described, the sections which are created by the cutting lines 216 and 217 are distributed alternatively onto said two masks.

Figure 10A:
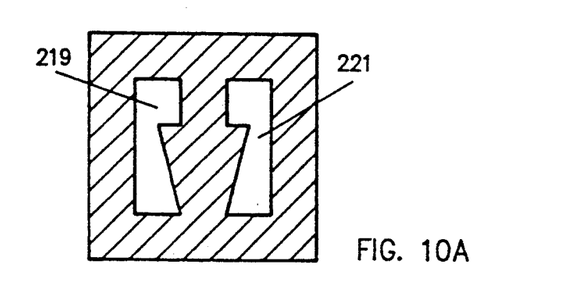
FIGS. 10a and 10b are top views of two complementary masks using the sections of FIG. 9c and which together correspond to the pattern of FIG. 8.
Figure 10B:
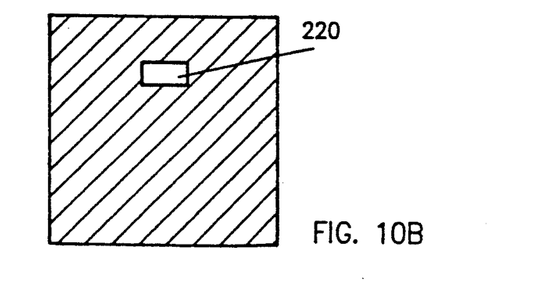

The two masks, as formed, are shown in FIG. 10a and 10b where said sections have the numerals 219, 220 and 221. Said sections represent physical holes in said masks. The sum of the areas of these holes in the masks of FIGS. 10a and 10b equal in the area of the pattern 200 shown in FIG. 8.

Figure 11:
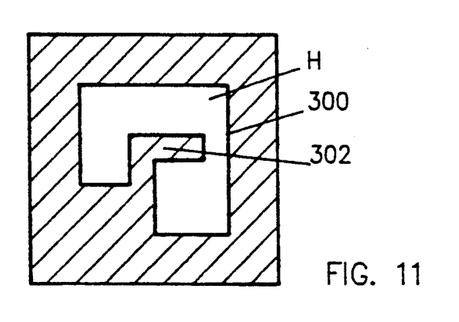
FIG. 11 is a top view of a polygonal pattern including a kind of a meander.

FIG. 11 shows a pattern H in the form of a polygon 300. Due to the form of the polygon 300 a meander is established with an inner part 302. When the pattern H is a hole in a mask this inner part 302 has no mechanical stability, that means that it would not be planar with the rest of the mask.

Figure 12A:
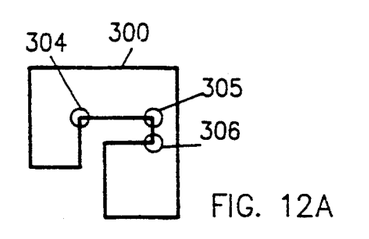
FIGS. 12a to 12d show the steps in which the pattern of FIG. 11 is divided into sections.

As already described, for splitting the pattern so as to form into two corresponding masks inside corners are first determined. These inside corners form a row and have the numerals 304, 305 and 306 as shown in FIG. 12a. Then the stability value S of said row of inside corners 304, 305 and 306 is compared with the stability limit function T.

For the purpose of explanation it is assumed that said row of inside corners 304, 305 and 306 shown in FIG. 12a is unstable.

According to the method as described, in conjunction with FIGS. 1 to 2c, all these unstable inside corners 304, 305 and 306 should be provided with cutting lines without checking if this is really necessary. It has been found that in cases with a row of inside corners as shown it may not be necessary to provide each of said inside corners with a cutting line. Sometimes only one or two cutting lines are sufficient.

Figure 9C:
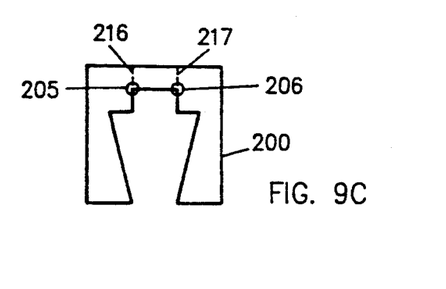
Figure 12B:
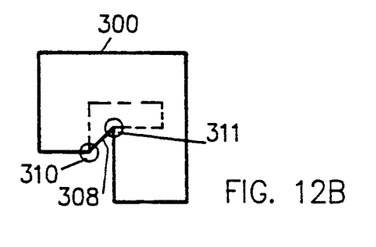

Accordingly, the steps employing the hull polygon as described in connection with FIGS. 9a, 9b and 9c can be carried out. Here the hull polygon is established by connecting all outside corners adjacent to the inside corners. These outside corners are 310 and 311 as shown in FIG. 12b. The line 308 connects these outside corners 310 and 311 and as shown, in FIG. 12b. The broken line in FIG. 12b depicts the inner part 302 of the polygon 300.

Following this the polygon 300 as modified in FIG. 12b is examined with respect to the mechanical stability of its inside corners. During this procedure the former outside corner 311 is now an inside corner with the consequence that its stability value S is compared with the stability limit function T.

For the purpose of this example, it is assumed that the former outside corner 311 is unstable.

Figure 12C:
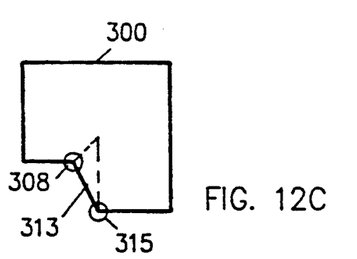
Figure 12D:
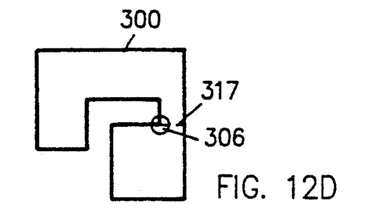
Figure 13A:
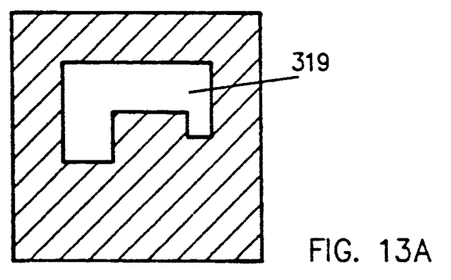
FIGS. 13a and 13b are top views of two complementary masks using the sections of FIG. 12b and which together correspond to the pattern of FIG. 11.
Figure 13B:
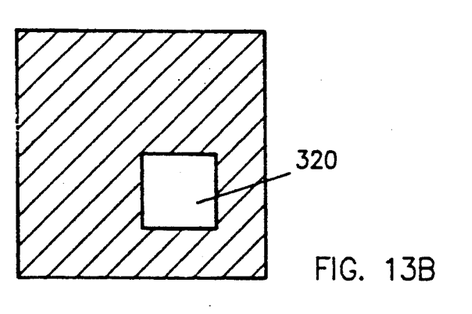

Due to this instability, the step of forming a hull polygon is repeated again. This is shown in FIG. 12c. There, the outside corners 308 and 315 which are adjacent to said former outside corner 311 which is now an inside corner are considered and connected with a line 313 which forms the new hull polygon.

The broken line in FIG. 12c depicts that portion of the former hull polygon now disregarded.

The new hull polygon is now examined with respect to its stability as already described above and it is assumed that the former outside corner 310 which is now an inside corner is stable. The last inside corner 311 is selected and as described in connection with FIG. 9c, the following inside corner 306 is determined. After that, a cutting line 317 is created in connection with the inside corner 306 according to the method already described and the sections 319 and 320 which are created by the cutting line 317 are distributed alternatively onto the two masks shown in FIG. 13a and 13b.

Figure 14:
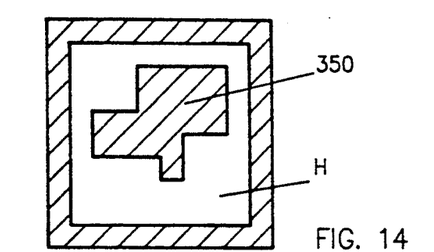
FIG. 14 is a top view of a polygonal pattern including an isolated inner area.
Figure 15A:
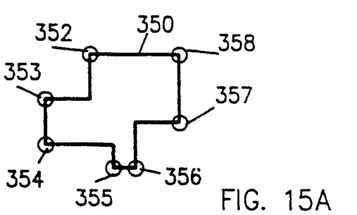
FIGS. 15a and 15b show the steps in which the pattern of FIG. 14 is divided into sections.
Figure 15B:
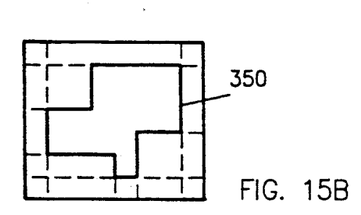
Figure 16A:
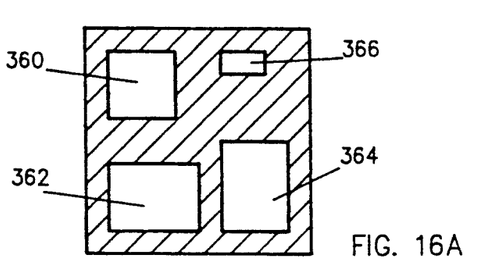
FIGS. 16a and 16b are top views of two complementary masks which incorporate the sections shown in FIG. 15b and which together correspond to the pattern of FIG. 14.
Figure 16B:
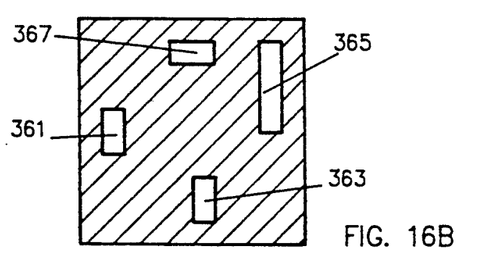

In connection with FIGS. 14 to 16 the splitting of a so-called inside polygon is described.

FIG. 14 shows an inside polygon 350 encircled by the pattern H.

In FIG. 15a the inside polygon 350 has all its inside corners which extend into the pattern H identified by the numerals 352, 353, 354, 355, 356, 357 and 358. As already described especially in connection with FIGS. 2a, 2b and 2c pairs of cutting lines are created in a next step and an optimal set of cutting lines is selected. This is shown in FIG. 15b. Said optimal set of cutting lines establishes sections which are then distributed alternatively onto two masks.

These two masks are shown in FIG. 16a and 16b where said sections have the numerals 360, 361, 362, 363, 364, 365, 366 and 367. All these sections represent physical holes in said masks with the result that the addition of these holes corresponds to the pattern H shown in FIG. 14.

Especially in connection with a so-called inside polygon, it is possible that the sections created with the help of the method described cannot be distributed alternatively to the two masks because the number of all sections or the number of sections surrounding a hole is odd prohibiting an even distribution between the different masks.

This can be detected by determining if the number of all sections defined is divisible by two. If not, one additional cutting line is added at any place where it divides one section into two without creating any intersections of cutting lines.

With respect to FIGS. 17 to 22 alternative methods will be described for partitioning a pattern.

Figure 17:
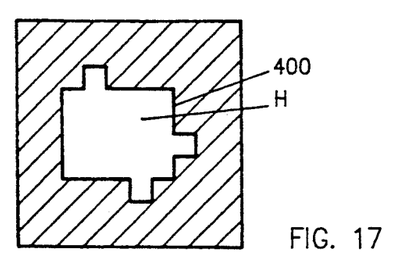
FIG. 17 is a top view of a polygonal pattern.

FIG. 17 shows a pattern H whose perimeter is defined by polygon 400. This pattern H can be defined by the two masks of FIGS. 18a and 18b established with the help of the above described method. The mask of FIG. 18a has one large section 402 and the mask of FIG. 18b is provided with sections 403, 404 and 405.

Figure 18A:
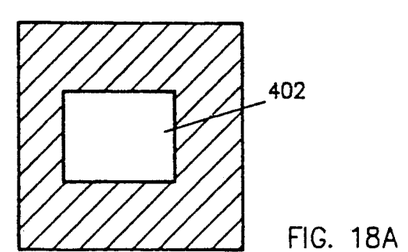
FIGS. 18a and 18b are top views of two complementary masks which correspond to the pattern of FIG. 17.
Figure 18B:
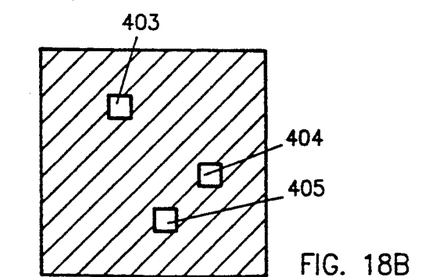

However, due to different thermal extensions it is not advantageous to have a large hole in a mask such as shown in FIG. 18a. This problem is solved by partitioning the large sections into smaller ones.

Figure 19:
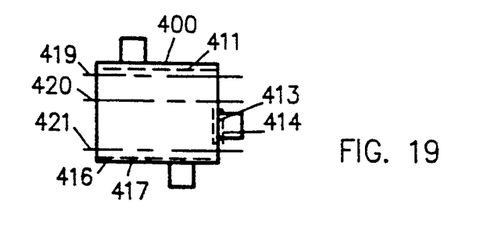
FIG. 19 show the step in which the layout of FIG. 17 is divided into small sections.

In FIG. 19 horizontal cutting lines are created. For that purpose, all horizontal edges are provided with a shadow region. As shown in FIG. 19, edge 410 is provided with shadow region defined by line 411 and edge 416 is provided with shadow region defined by line 417. Then, all vertical cutting lines which were created by the described method as shown in FIGS. 18a and 18b are provided with a shadow region. In FIG. 19, it is the cutting line 413 which is provided with a shadow 414. Within these shadow regions additional horizontal cutting lines for partitioning said large section are not allowed.

Now, horizontal cutting lines are created which do not touch any of said shadow regions 411, 414 and 417. These additional horizontal cutting lines have the numerals 419, 420 and 421 in FIG. 19.

Figure 20A:
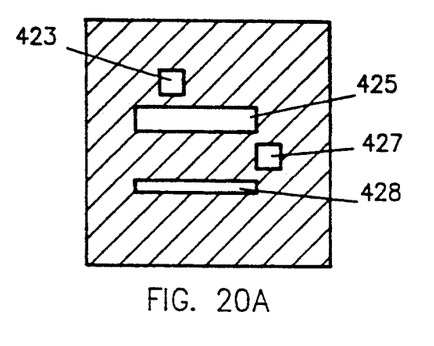
FIGS. 20a and 20b, are top views of two complementary masks which together incorporate the small sections of FIG. 19 and FIG. 21, which correspond to the pattern of FIG. 17.
Figure 20B:
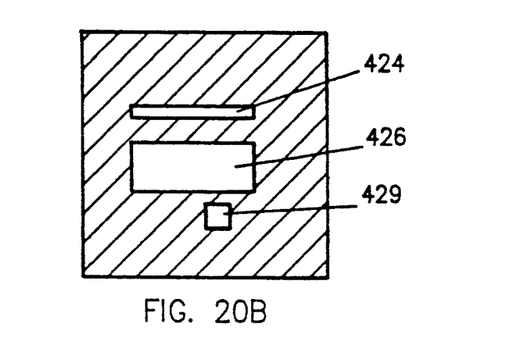

The result of the above partitioning is shown in FIGS. 20a and 20b. The mask of FIG. 20a is provided with sections 423, 425, 427 and 428 where the sections 423 and 427 correspond to the sections 403 and 404 of FIG. 18b. The mask of FIG. 20b is provided with sections 424, 426 and 429 where the section 429 corresponds to the section 405 of FIG. 18b. This has the consequence that the sections 424, 425, 426 and 428 of the masks of FIGS. 20a and 20b taken together represent the large section 402 of the mask of FIG. 18a while all the sections of the masks shown in FIGS. 20a and 20b taken together correspond to the pattern H of FIG. 17.

Figure 21:
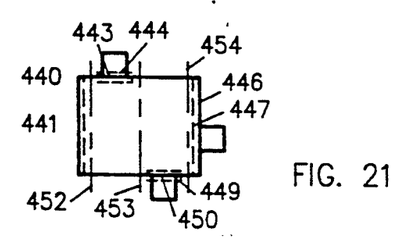
FIG. 21 show the step in which the layout of FIG. 17 is divided into small sections.

FIG. 21 depicts the same method but uses vertical cutting lines. In FIG. 21 the edges 440 and 446 are provided with shadow regions 441 and 447 and the cutting lines 443 and 449 are provided with shadow regions 444 and 450. Between these shadow regions additional vertical cutting lines are created which have the numerals 452, 453 and 454.

Figure 22A:
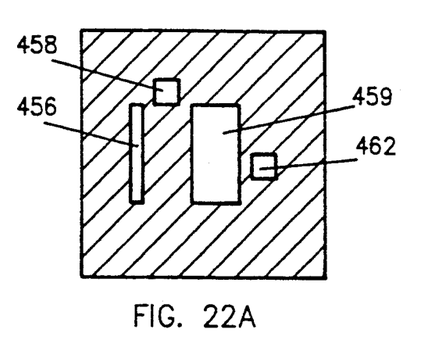
FIGS. 22a and 22b are top views of two complementary masks which together incorporate the small sections of FIG. 19 and FIG. 21, which correspond to the pattern of FIG. 17.
Figure 22B:
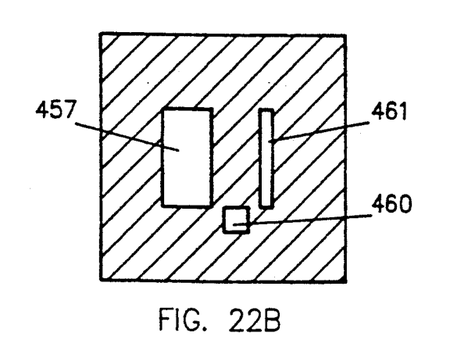

The result of the described partitioning is shown in FIGS. 22a and 22b where two masks are shown which have sections 456, 457, 458, 459, 460, 461 and 462. Thus, the large section 402 of FIG. 18a is divided into the sections 456, 457, 459 and 461 shown in FIGS. 22a and 22b. All the sections 456 to 462 of FIGS. 22a and 22b summed up correspond to the pattern H shown in FIG. 17.

Figure 23A:
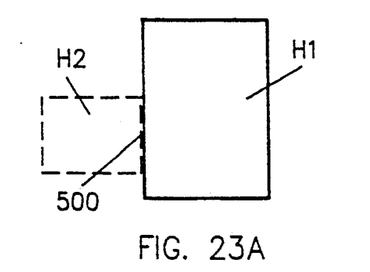
FIGS. 23a and 23b, FIGS. 24a, 24b, 24c and FIGS. 25a and 25b show different ways of overlapping sections of two complementary masks.
Figure 23B:
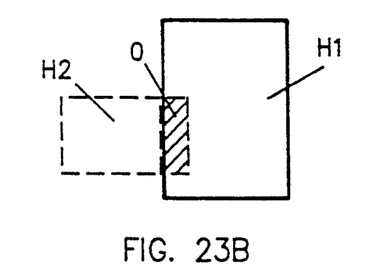
Figure 24A:
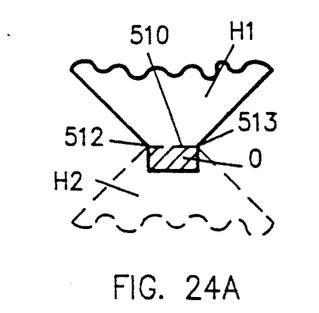
Figure 24B:
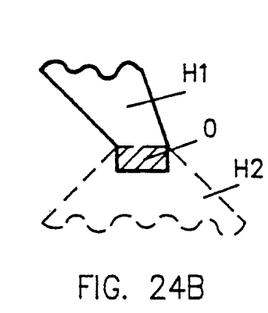
Figure 24C:
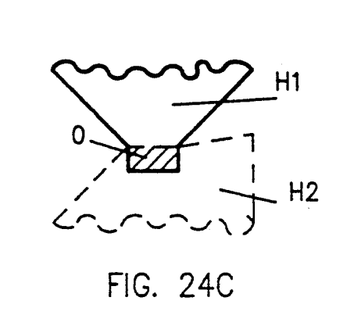
Figure 25A:
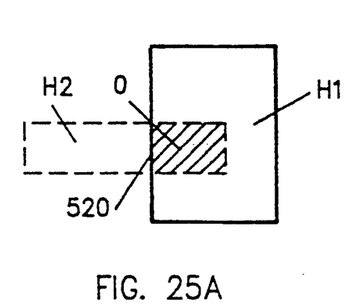
Figure 25B:
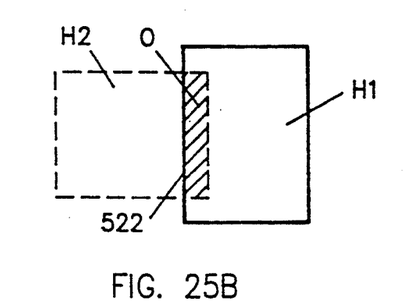

An essential requirement for creating such dual masks created by the described method is the ability to adjust the formed masks in exact overlay positions. Overlaps as shown in FIGS. 23 to 25 avoid the need for expensive adjustment tools and methods. In all these FIGS. 23 to 25 a hole in a first mask is shown in full line and marked H1 and another hole in a second mask is shown in broken line and marked H2. The area where the hole H1 and the hole H2 overlap is hatched and marked with 0.

In FIG. 23a the holes H1 and H2 of the two masks are without overlap and touch each other along the line 500. If the two masks are not exactly positioned, a faulty small bridge will remain after exposure.

In FIG. 23b the hole H2 extends into the hole H1 with the effect that an overlap 0 is created. Due to the overlap 0 inexact positioning of the two masks does not result in a bridge.

When the two holes H1 and H2 have only a common edge but no common corner, the hole H2 with the shorter edge is elongated for extending into the hole H1.

FIG. 24a shows two holes H1 and H2 which originally had one common edge 510 and two common corners 512 and 513. The overlap 0 is added to the hole H1 and requires two additional edges and creates two additional inside corners extending slightly into the hole H1.

In FIG. 24b, the hole H1 is different and again the overlap 0 is added again to the hole H1.

FIG. 24c shows an example in which the hole H2 is changed. Again, the overlap 0 is added to the hole H1. In this case, the addition of the overlap 0 to the hole H2 would cause an additional inside corner extending sharply into the hole H2.

According to another feature of the invention, the width of the overlap is determined by the length of the common edge. This is shown in FIGS. 25a and 25b.

In FIG. 25a, the length of the common edge is defined by the original common cutting line which has the numerals 520 in FIG. 25a and which is the accompanying edge of the original hole H2. As this cutting line 520 is short, the original hole H2 is elongated into the hole H1 by a great amount.

In contrast to that, the original common cutting line in FIG. 25b which has the numerals 522 is long so that the original hole H2 is elongated into the hole H1 by a small amount.

Having now described in detail the present invention, We claim:

1. A method of splitting a layout of a hole pattern having a plurality of edges and having inside corners and outside corners so as to be able to form complementary self-supporting semiconductor masks, said method comprising:

determining all inside and outside corners of said pattern, assigning a stability value to each of said inside corners which is a function of the length of the perimeter of all edges between adjacent outside corners, and the length of the shortest distance between the adjacent outside corners, comparing the stability value of each inside corner with a pre-established stability limit function which is dependent on the physical characteristics of the masks being formed, partitioning each pattern into a plurality of sections by providing cutting lines running from any inside corner with said assigned stability value below said stability limit function to an opposing edge of said pattern, and establishing said two masks by distributing said sections alternatively across said masks.

2. The method of claim 1 wherein said step of assigning a stability value to each of said inside corners comprises, adding the lengths of the perimeter of all edges between adjacent outside corners, ascertaining the length of the shortest distance of said adjacent outside corners, and dividing said distance by the sum of the added lengths.

3. The method of claim 2 wherein said stability limit function increases, when said distance of said two adjacent outside corners increases.

4. A method of claim 1 wherein said step of partitioning said pattern comprises:
planning pairs of rectangular cutting lines running from any one of said inside corners to one of said opposing edges, respectively,
assembling one or more sets of cutting lines which incorporate one cutting line of each of said pairs of cutting lines, respectively, and in which said cutting lines do not intersect, and
selecting that set of cutting lines which has the shortest length of all cutting lines summed up.

5. The method of claim 1 wherein said step of partitioning said pattern comprises:
determining all sections with a surface area exceeding a given value, and
partitioning each of said sections into sub-sections by providing additional cutting lines which run between two of said cutting lines of said sections and which do not intersect any other cutting 6. The method of claim 1 wherein:
said partitioning step includes determining the number of sections into which the pattern is positioned,
determining if said number is divisible by two and further providing additional cutting lines to create a number of sections divisible by two.

* * * * *